United States Patent [19]
Kirkpatrick et al.

[11] Patent Number: 5,998,242
[45] Date of Patent: Dec. 7, 1999

[54] VACUUM ASSISTED UNDERFILL PROCESS AND APPARATUS FOR SEMICONDUCTOR PACKAGE FABRICATION

[75] Inventors: Galen C. Kirkpatrick, Phoenix, Ariz.; Manickam Thavarajah, San Jose, Calif.; Sunil A. Patel, Los Altos, Calif.; Stephen A. Murphy, San Jose, Calif.

[73] Assignee: LSI Logic Corporation, Milpitas, Calif.

[21] Appl. No.: 08/958,776

[22] Filed: Oct. 27, 1997

[51] Int. Cl.⁶ .................................................. H01L 21/44
[52] U.S. Cl. ........................... 438/127; 438/118; 438/124
[58] Field of Search .................................... 438/118, 124, 438/125, 126, 127; 264/272.17

[56] References Cited

U.S. PATENT DOCUMENTS

| | | | |
|---|---|---|---|
| 5,663,106 | 9/1997 | Karavakis et al. | 438/126 |
| 5,817,542 | 10/1998 | Sakeml | 438/118 |
| 5,817,545 | 10/1998 | Wang et al. | 438/127 |
| 5,866,442 | 2/1999 | Brand | 438/126 |

OTHER PUBLICATIONS

"Breakthrough Vacuum Dispensing for Micro BGA Underfill", CAM/ALOT Liquid Dispensing Systems Catalog, p. 2. No Date.

"CAM/ALOT 3900 Vacuum Dispensing System", CAM/ALOT Liquid Dispensing Systems, Product Release No. 106 No Date.

*Primary Examiner*—Kevin M. Picardat
*Attorney, Agent, or Firm*—Beyer & Weaver, LLP

[57] ABSTRACT

A semiconductor chip fabrication assembly and method including a semiconductor package having a packaging substrate and a semiconductor die. An active circuit surface of the semiconductor die is positioned adjacent to a contact surface of the packaging substrate such that a substantially thin gap is formed therebetween. A semi-rigid shroud device is provided which defines a vacuum chamber configured to extend around the gap to hermetically seal the gap within the vacuum chamber. A dispensing device is provided having an outlet end positioned proximate the gap in the vacuum chamber which is adapted to vacuum flow the bonding material between the electrical contacts in the gap, and between the active circuit surface and the contact surface. The absence of air and any other gases forms a substantially voidless underfill layer of bonding material in the gap.

23 Claims, 3 Drawing Sheets

VACUUM ASSISTED UNDERFILL PROCESS AND APPARATUS FOR SEMICONDUCTOR PACKAGE FABRICATION

TECHNICAL FIELD

This present invention relates, generally, to semiconductor flip-chip package fabrication, and, more particularly, relates to underfill processes for flip chip packaging assembly.

BACKGROUND ART

In semiconductor device assembly, a semiconductor chip (or "die") may be bonded directly to a packaging substrate, without the need for a separate leadframe or for separate I/O connectors (e.g. wire or tape). Such chips are formed with ball-shaped beads or bumps of solder affixed to their I/O bonding pads. During packaging, the chip is "flipped" onto its active circuit surface in a manner forming a direct electrical connection between the solder bumps of the chip and conductive traces on a packaging substrate. Semiconductor chips of this type are commonly referred to as "flip chips", and are advantageously of a comparatively reduced size.

Briefly, as shown in FIG. 1, a conventional semiconductor flip chip package 10 is illustrated in which a semiconductor die 11 and a packaging substrate 12 are electrically connected and mechanically bonded. The semiconductor die 11 includes an active circuit surface 13 on which are arranged solder balls 15. The solder may be composed of a low melting point eutectic material or a high lead material, for example. It should be noted that this figure is intended to be representative and, does not show the solder balls 15 in proportion to the semiconductor die 11. In current designs, the die may have dimensions on the order of 0.5×0.5 inch whereas the unbonded solder balls may have a diameter on the order of 4 to 5 mils.

Prior to bonding the die 11 to a substrate, solder flux is applied to either the active circuit surface 13 of the die 11 or the packaging substrate surface. The flux serves primarily to aid the flow of the solder, such that the solder balls 15 make good contact with traces on the packaging substrate. It may be applied in any of a variety of methods, including brushing or spraying, or dipping the die 11 into a thin film, thereby coating the solder balls 15 with flux. The flux generally has an acidic component, which removes oxide barriers from the solder surfaces, and an adhesive quality, which helps to prevent the die from moving on the packaging substrate surface during the assembly process.

After the flux is applied, the die 11 is aligned with and placed onto a placement site on the packaging substrate 12 such that the die's solder balls 15 are aligned with electrical traces (not shown) on the substrate 12. The substrate is typically composed of a laminate or organic material, such as fiber glass, PTFE (such as TEFLON™, available from Gore, Eau Claire, Wis.) BT resin, epoxy laminates or ceramic-plastic composites. Heat (to a temperature of about 220° C., for example) is applied to one or more of the die 11 and the packaging substrate 12, causing the solder balls 15 to reflow and form electrical connections between the die 11 and the packaging substrate 12. Then, the remaining flux residue is substantially removed in a cleaning step, for instance by washing with an appropriate solvent.

At this point, the mechanical bonding procedure can begin. An underfill material, typically a thermo-set epoxy 16, such as is available from Hysol Corporation of Industry, California (product numbers 4511 and 4527), Ablestik Laboratories of Rancho Domingo, Calif., and Johnson Matthey Electronics of San Diego, Calif., is dispensed into the remaining space 17 (or "gap") between the die 11 and the substrate 12. In a typical procedure, a bead of thermo-set epoxy, is applied along one edge of the die at atmospheric pressure where it is drawn under the die through capillary action until it completely fills the gap between the die and the packaging substrate. Slight heating of the packaging substrate after dispensing of the underfill epoxy assists the flow.

After the epoxy 16 has bled through the gap 17, a separate bead of epoxy (not shown) may also be dispensed and bonded around the perimeter of the die 11. Thereafter, the epoxy (both the underfill and perimeter bonding epoxy, if any) are cured by heating the substrate and die to an appropriate curing temperature, for example, about 130° C. to about 165° C. In this manner the process produces a mechanically, as well as electrically, bonded semiconductor chip assembly, with the underfill material 16 allowing a redistribution of the stress at the connection between the die 11 and the packaging substrate 12 from the solder joints 15 only to the entire sub-die area. FIG. 1 illustrates the semiconductor die 11 interconnected to the packaging substrate 12 electrically by solder joints 15 and mechanically by a cured layer of epoxy 16.

While this conventional assembly process is adequate in many instances, several drawbacks are inherent with this design. For example, the entire flip chip assembly process includes a number of separate steps, each of which take several seconds to several minutes to perform. As noted, the step of dispensing epoxy and allowing it bleed under the gap between the die active circuit surface and the substrate alone requires several minutes. The prolonged process time reduces the throughput of the assembly process, thus limiting the production capacity and the commercial competitiveness of flip chip devices.

For a given die/package combination, the underfill epoxy flow conditions may be optimized to minimize process time, but the dynamics of the underfill epoxy flow within the gap are very sensitive to the topology of the traces on the packaging substrate and of the arrangement of solder connections to the die. Thus, optimization of the underfill flow conditions would have to be repeated for each device design which uses even a slightly different I/O configuration. Unfortunately, such process-to-process optimization generally is prohibitively time-consuming and expensive.

Another serious concern in the above-described flip chip device assembly process is the danger of voiding during the flow of the underfill epoxy in the gap between the die and the packaging substrate (i.e., the formation of spaces within the gap into which the underfill epoxy does not flow). Due to the wall effects and internal shear stress of the underfill material, the filling process often causes voids of trapped air and moisture to form therein.

As set forth above, the underfill epoxy is intended to impart mechanical strength to the chip device. Unfortunately, upon repeated thermal cycling between room temperature and ~100° C. and due to the greater coefficients of expansion, these voids of entrapped air and moisture expand and contract at rates different than the surrounding underfill material. Accordingly, the formation of stress concentrations can cause delamination of the layered chip which may ultimately propagate throughout the whole chip.

One factor which contributes to voiding is flux residue remaining in the gap between the die 11 and the packaging substrate 12 after reflow. Any such remaining flux residue may prevent wetting by the underfill epoxy 16 within the gap 17 and so must be removed prior to the dispense and flow of the underfill epoxy. Further, the acidic components of the flux, if allowed to remain on the surface of the die and/or the packaging substrate, may later corrode the flip chip device, and so the flux residue must be removed for that reason as well.

Typically, flux is removed by applying a solvent to the chip device at high pressures. Unfortunately, such solvent is commonly a hydrocarbon-based liquid having a high flash point and high toxicity, creating numerous safety concerns and environmental problems associated with waste solvent disposal.

DISCLOSURE OF INVENTION

Accordingly, it is an object of the present invention to improve mechanical bonding of a semiconductor die to a packaging substrate during the fabrication process of a semiconductor packaging assembly.

It is another object of the present invention is to provide a flip chip packaging fabrication method and apparatus which reduces stress concentrations in the cured underfill bonding layer between the die and the packaging substrate during operation thereof.

Another object of the present invention is to provide a flip chip packaging fabrication method and apparatus which reduces voiding of the underfill bonding material in a gap between the die and the packaging substrate.

A further object of the present invention is to reduce fabrication time of the underfill process of a flip chip packaging assembly.

Still another object of the present invention to facilitate flow of the bonding material into the gap.

Yet another object of the present invention is to provide a flip chip packaging fabrication method and apparatus which reduces flux residual in the gap between the die and the packaging substrate.

It is a further object of the present invention to provide a flip chip packaging fabrication method and apparatus which enhances durability, is compact, and reduces manufacturing costs.

In accordance with the foregoing objects, the present invention provides a semiconductor chip fabrication assembly including a semiconductor package having a packaging substrate and a semiconductor die. An active circuit surface of the semiconductor die is positioned adjacent to a contact surface of the packaging substrate such that a substantially thin gap is formed therebetween. The active circuit surface is electrically coupled to the contact surface at a plurality of electrical contacts in the gap. The fabrication assembly further includes a semi-rigid shroud device defining a vacuum chamber which is configured to extend around the gap between the active circuit surface and the contact surface. This shroud device hermetically seals the gap within the vacuum chamber such that a vacuum can be formed therein. A dispensing device is provided having an outlet end positioned proximate the gap in the vacuum chamber. The dispensing device is further adapted to vacuum flow the bonding material between the electrical contacts, and between the active circuit surface and the contact surface to form a substantially voidless underfill layer of bonding material therebetween.

A heater block device may be included which is configured to thermally contact a bottom surface of the packaging substrate. The heater block defines a sealing surface which sealably mates with a vacuum seal surface of the belljar-shaped shroud. The dispensing device includes a needle portion having the outlet end at a distal end thereof which is formed to pierce through the shroud for positioning of the outlet end proximate the gap to dispense the bonding material.

In another aspect of the present invention, a method for underfilling a substantially thin gap with bonding material is provided including the steps of forming a vacuum chamber around the gap between the die and the packaging substrate; and creating a vacuum in the vacuum chamber. The method of the present invention further includes the step of dispensing an uncured insulative bonding material into the gap contained in the vacuum chamber in a manner flowing the bonding material between the electrical contacts and between the active circuit surface and the contact surface to form a substantially voidless underfill layer of bonding material therebetween.

The forming step includes placing a semi-rigid shroud around the gap between the active circuit surface and the contact surface in a manner hermetically sealing the gap within the vacuum chamber. The dispensing step further includes the step of piercing a needle through the shroud until a distal end thereof is positioned proximate the gap, and injecting the bonding material through the needle such that the bonding material flows into the gap through capillary action.

BRIEF DESCRIPTION OF THE DRAWING

The assembly of the present invention has other objects and features of advantage which will be more readily apparent from the following description of the best mode of carrying out the invention and the appended claims, when taken in conjunction with the accompanying drawing, in which:

BEST MODE OF CARRYING OUT THE INVENTION

Figure 1:
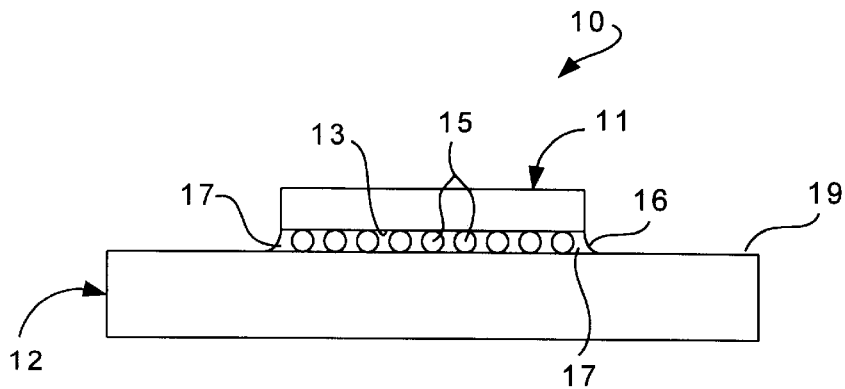
FIG. 1 is a side elevation view of a flip-chip packaging assembly illustrated the underfill layer between a die and a packaging substrate.

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 2:
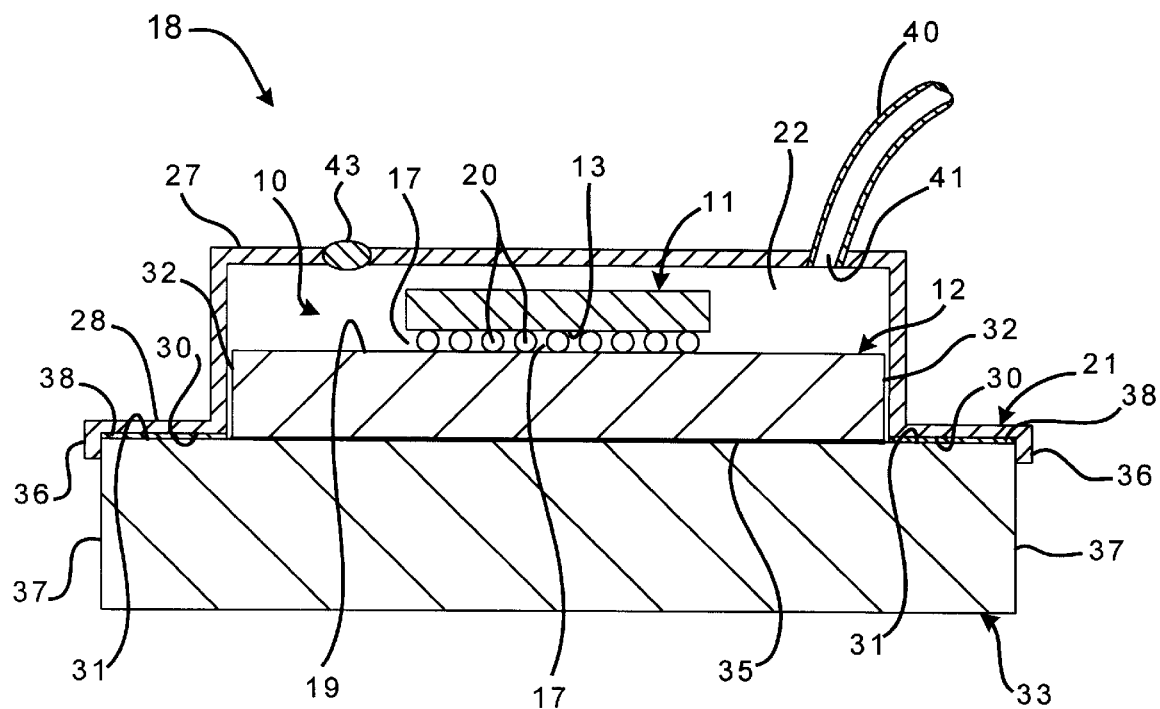
FIG. 2 is an enlarged side elevation view, in cross-section, of a flip-chip packaging fabrication assembly constructed in accordance with the present invention, and taken substantially along the plane of the line 2—2 in FIG. 3.
Figure 3:
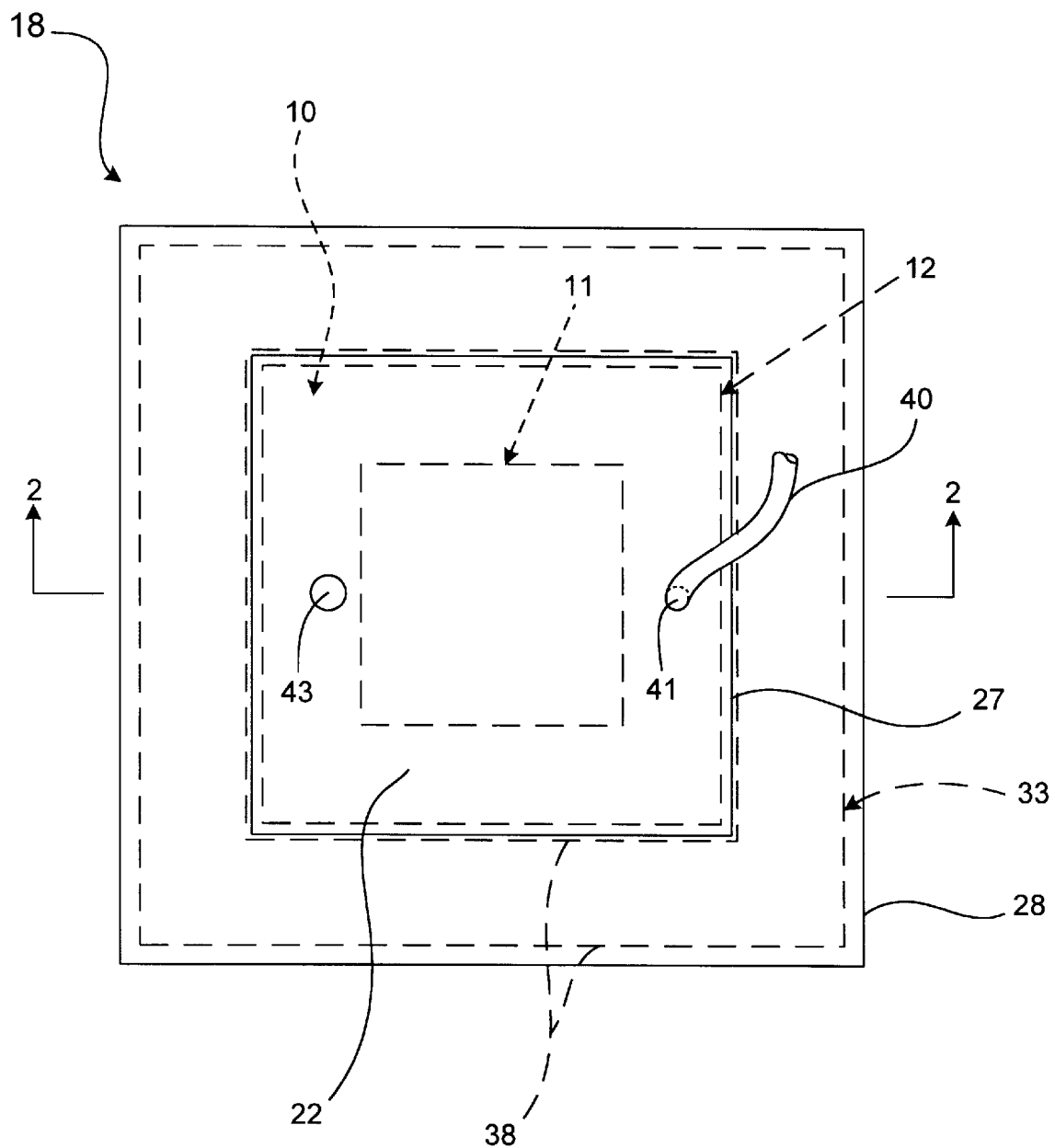
FIG. 3 is a reduced top plan view of the flip-chip packaging fabrication assembly of FIG. 2.
Figure 4:
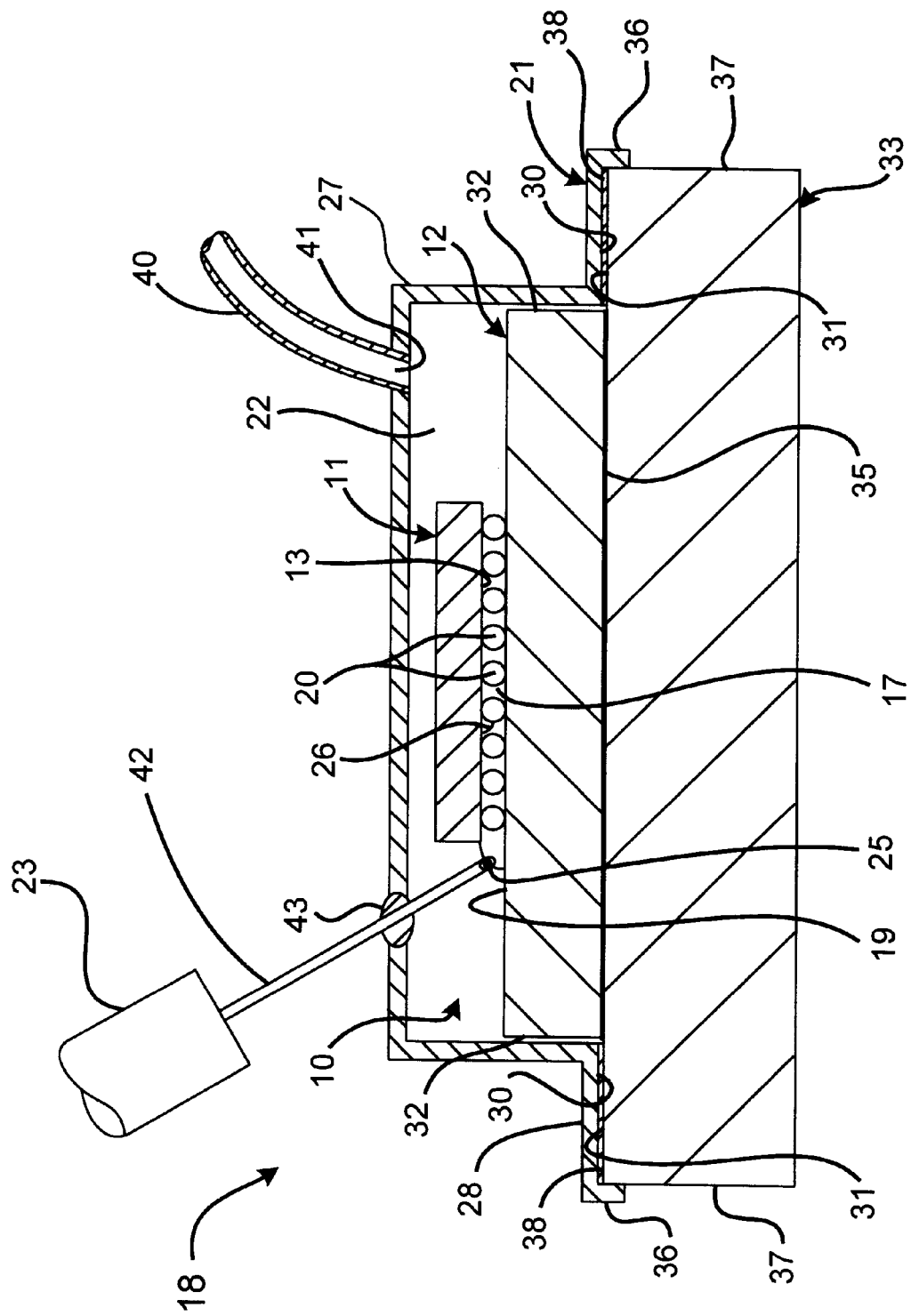
FIG. 4 is a side elevation view, in cross-section, of the flip-chip packaging fabrication assembly of FIG. 2 illustrating the deposition of the epoxy into a gap formed between the die and the packaging substrate.

Attention is now directed to FIGS. 2–4 where a semiconductor packaging fabrication assembly, generally designated 18, is illustrated including a semiconductor package 10 having a packaging substrate 12 and a semiconductor die 11.

An active circuit surface 13 of the semiconductor die 11 is positioned adjacent to a contact surface 19 of the packaging substrate 12 such that a substantially thin gap 17 is formed therebetween. The active circuit surface 13 is electrically coupled to the contact surface 19 through a plurality of electrical contacts 20 in the gap 17. The fabrication assembly 18 further includes a semi-rigid shroud device, generally designated 21, which defines a vacuum chamber 22 configured to extend around the gap 17 between the active circuit surface 13 and the contact surface 19. This shroud device 21 hermetically seals the gap 17 within the vacuum chamber 22 such that a vacuum can be formed therein. A dispensing device, generally designated 23, is provided having an outlet end 25 positioned proximate the gap 17 in the vacuum chamber 22. The dispensing device 23 is further adapted to vacuum flow the bonding material 26 (FIG. 4) between the adjacent electrical contacts 20, and between the active circuit surface 13 and the contact surface 19 to form a substantially voidless underfill layer of bonding material therebetween.

Accordingly, the semiconductor packaging fabrication assembly of the present invention substantially reduces the occurrence of effect of voiding of trapped air and moisture in the underfill layer. Should normal voiding occur during the vacuum assisted underfill process, the partially evacuated bubbles will shrink or collapse upon subjection to normal atmospheric pressure before curing of the underfill. Typically, the greater the vacuum, the more the voids will collapse at atmospheric pressure. Achieving too high a vacuum, however, may cause certain types of liquid epoxies to "boil" off their volatile components. The preferred vacuum, therefore, is in the range of about 5 in. Hg to about 20 in. Hg, since a perfect vacuum (30 in. Hg) may be undesirable for some materials.

After the semiconductor die 11 and the packaging substrate 12 are electrically coupled together through conventional soldering techniques to form the electrical contacts 20, the shroud device 21 may be employed to subject the gap 17 to a vacuum. In the preferred embodiment and as shown in FIGS. 2 and 3, shroud device 21 is belljar-shaped including an upper portion 27 and a lower seal portion 28. The upper portion 27 defines vacuum chamber 22 and is configured to extend substantially around and surround at least the semiconductor die 11 and the gap 17 for enclosure of the same therein. The lower seal portion 28 includes a vacuum seal surface 30 formed to mate with an opposed sealing surface 31 of the semiconductor package 10 in a manner creating a hermetic seal therebetween. Accordingly, the vacuum formed in the chamber, preferably between about 10 in. Hg to about 20 in. Hg, substantially reduces the occurrence of voids in the uncured bonding material during the underfill process.

In the preferred embodiment, upper portion 27 of shroud device 21 further extends around the side walls 32 of packaging substrate 12 such that the die 11, the packaging substrate 12 and the gap 17 formed therebetween are collectively enclosed within vacuum chamber 22 when the shroud device 21 engages the semiconductor package 10.

The fabrication assembly 18 preferably includes a heater block device 33 which is configured to thermally contact a bottom surface 35 of the packaging substrate 12 during fabrication. This heater block 33 facilitates flow of the bonding material which is preferably provided by a thermoset epoxy. As best shown in FIG. 2, heater block 33 defines substantially planar sealing surface 31 which horizontally and radially extends beyond the vertical side walls 32 of packaging substrate 12. Similarly, the lower seal portion 28 of shroud device 21 extends horizontally and radially outward from upper portion 27 to conform with sealing surface 31. As either the shroud device 21 and/or the heater block 33 are vertically positioned into mating engagement with one another, the downward facing vacuum seal surface 30 of shroud device 21 engages the opposed upward facing sealing surface 31 of the heater block.

The lower seal portion 28 of shroud device 21 may include a downwardly extending peripheral lip portion 36 which partially extends around the side walls 37 of the heater block. Lip portion 36 facilitates proper sealing between the sealing surface 31 and the vacuum sealing surface 31, as well as facilitating centering of the shroud device with the heater block. In this component arrangement, as viewed in FIGS. 2 and 3, the die, the packaging substrate and the gap will be properly enclosed in vacuum chamber 22. It will appreciated, however, that the shroud device 21 may be configured such that the vacuum seal surface 31 thereof sealably mates with the contact surface 19 or the side walls 32 of the packaging substrate without departing from the true spirit and nature of the present invention.

To further enhance sealing between the sealing surface 31 of the heater block and the vacuum sealing surface of the shroud device, a sealing gasket 38 is preferably included therebetween. FIG. 3 illustrates that gasket 38 preferably conforms with the mating sealing surfaces between the heater block and the shroud device.

Due to the heat generated by heater block 33, the gasket must composed of a material capable of withstanding the elevated temperatures experienced when contacting the heated sealing surface 31 of the heater block 33. For example, the gasket material may be provided by TEFLON® or the like that withstand high temperature operation.

Similarly, the shroud device 21 must be sufficiently flexible to enable conformance of the vacuum seal surface against the sealing surface of the heater block, yet be sufficiently rigid so as not to inwardly collapse when exposed to the vacuum of the vacuum chamber. In the preferred form, the shroud device is composed of LEXAN™ or the like.

To generate a vacuum in vacuum chamber 22, a vacuum pump (not shown) is communicably coupled to the upper portion 27 of shroud device through a vacuum hose 40. As shown in FIG. 2, the distal end of the vacuum hose 40 terminates at the shroud upper portion 27 where a vacuum port 41 communicates with vacuum chamber 22. The vacuum pump device may be provided by any conventional vacuum pump which is capable of generating a vacuum in the chamber of preferably between about 10 in. Hg to about 20 in. Hg.

Once the shroud device 21 is properly centered, aligned and positioned over die 11 and packaging substrate 12, the vacuum seal surface 30 thereof may be positioned in mating relation with the sealing surface 31. Subsequently, the vacuum pump device will be caused to draw air from vacuum chamber 22, via vacuum hose 40, in a manner creating a vacuum in vacuum chamber, and hence, gap 17. As the vacuum in the vacuum chamber increases, the vacuum seal surface 30 is caused to more forcibly contact sealing surface 31, further increasing the sealing integrity therebetween. Moreover, during operation of the vacuum pump, residual flux and/or solvent may be beneficially removed from the electrical contacts, and the opposed surfaces defining the gap.

Referring now to FIG. 4, dispensing device 23 is illustrated penetrating through the upper portion 27 of the shroud device to position the outlet end 25 thereof proximate the gap 17 in the vacuum chamber 22. In the preferred form, dispensing device 23 is provided by a syringe-type applicator which includes a needle portion 42 adapted to pierce through the upper portion 27 of shroud device 21. At the distal end of needle portion 42 is a pointed outlet end 25 formed to pierce through the shroud and deliver the thermoset epoxy into the gap under the vacuum environment.

To facilitate access through the shroud device 21 without sacrificing vacuum integrity in the vacuum chamber 22, a resilient needle gasket 43 is provided at the upper portion 27 of the shroud. This resilient gasket enables piercing by the needle portion 42 of the dispensing device 23, while simultaneously forming a hermetic seal around the shaft of the needle portion as the same penetrates the shroud. Such a gasket material includes silicon rubber or the like.

Once the outlet end 25 of the needle portion 42 is positioned near the peripheral edge of the gap 17, a conventional positive displacement valve (not shown) or the like may be actuated to supply the uncured underfill epoxy through the needle portion and to the peripheral edge of the gap. The displacement valve couples the needle portion to a bonding material reservoir (not shown) which supplies the uncured underfill epoxy to the needle portion.

Once the underfill epoxy is dispensed from the needle outlet end 25 at a peripheral edge of the gap, the bonding material is drawn between the electrical connections, and between active circuit surface and the contact surface through the capillary action and gravity. Due to the vacuum technique, a substantially voidless underfill layer of bonding material is formed therebetween.

It will be understood that while needle portion 42 preferably pierces the shroud upper portion 27 through a top side thereof, the dispensing device could be adapted pierce through a side wall thereof. Moreover, the needle portion could be provided by a semi-rigid or a flexible tube more permanently mounted to the shroud upper portion 27.

From the description of the present apparatus, it will be understood that the method of the present invention for underfilling the substantially thin gap 17 with bonding material 26 includes the steps of: forming a vacuum chamber 22 around gap 17 between the die and packaging substrate 12; and creating a vacuum in vacuum chamber 22. The next step includes dispensing uncured insulative bonding material 26 into gap 17 contained in vacuum chamber 22 in a manner flowing the bonding material 26 between the electrical contacts 20, and between the active circuit surface 13 and the contact surface 19 to form a substantially voidless underfill layer of bonding material 26 therebetween.

The forming step includes the step of placing a semi-rigid shroud device 21 around the gap 17 in a manner hermetically sealing gap 17 within vacuum chamber 22. The placing step may include the step of placing the shroud around the packaging substrate in a manner hermetically sealing the gap, the die and the packaging substrate within the vacuum chamber.

The vacuum chamber forming step further includes the step of sealing the vacuum seal surface 30 of shroud device 21 with sealing surface 31 of the heater block 33.

In the preferred embodiment, the dispensing step further includes the step of piercing needle portion 42 through the shroud device 21 until a distal end thereof is positioned proximate gap 17. The bonding material may then be bled or injected through the needle portion 42 such that the bonding material 26 flows into gap 17 through capillary action.

What is claimed is:

1. A method for underfilling a substantially thin gap with bonding material, said gap being formed between an active circuit surface of a semiconductor die and a contact surface of a packaging substrate when said active circuit surface is electrically coupled to said contact surface at a plurality of electrical contacts therebetween, said method comprising the steps of:
    forming a vacuum chamber around the gap between said die and said packaging substrate;
    creating a vacuum in said vacuum chamber; and
    dispensing an uncured insulative bonding material into said gap contained in said vacuum chamber in a manner flowing the bonding material between said electrical contacts and between the active circuit surface and the contact surface to form a substantially voidless underfill layer of bonding material therebetween.

2. The method as defined of claim 1 wherein,
    said forming a vacuum chamber step includes the step of placing a semi-rigid shroud around said gap between the active circuit surface and the contact surface in a manner hermetically sealing said gap within said vacuum chamber.

3. The method as defined of claim 2 wherein,
    said placing step include placing the shroud around the packaging substrate in a manner hermetically sealing said gap, said die and said packaging substrate within said vacuum chamber.

4. The method as defined of claim 3 wherein,
    said packaging substrate includes a bottom surface in thermal contact with a heater block; and
    said forming a vacuum chamber step further includes the step of sealing a vacuum seal surface of said shroud with a sealing surface of said heater block.

5. The method as defined of claim 4 wherein,
    said sealing surface of said heater block is upward facing and extends radially beyond the bottom surface of said packaging substrate, and
    said shroud is belljar-shaped such that said vacuum seal surface is downward facing and opposite the heater block sealing surface.

6. The method as defined of claim 1 wherein,
    said semi-rigid shroud is composed of LEXAN.

7. The method as defined of claim 1 wherein,
    said dispensing step includes the step of bleeding said bonding material into said gap through capillary action.

8. The method as defined of claim 1 wherein,
    said dispensing step includes the step of injecting said bonding material into said gap.

9. The method as defined of claim 7 wherein,
    said bonding material is provided by thermo-set epoxy.

10. The method as defined of claim 2 wherein,
    said dispensing step includes the step of bleeding said bonding material into said gap through capillary action.

11. The method as defined of claim 10 wherein,
    said bleeding step is performed by injecting said bonding material through a needle having an outlet positioned proximate said gap.

12. The method as defined of claim 10 further wherein,
    said dispensing step further includes the step of, before said bleeding step, piercing a needle through said shroud until a distal end thereof is positioned proximate said gap, and
    injecting said bonding material through said needle such that said bonding material flows into said gap through capillary action.

13. The method as defined of claim 12 further wherein, said shroud includes a needle gasket for piercing of said needle.

14. The method as defined of claim 13 wherein, said bonding material is provided by thermo-set epoxy.

15. A semiconductor chip fabrication assembly comprising:

a semiconductor package including:
  a packaging substrate defining a contact surface; and
  a semiconductor die defining an active circuit surface positioned adjacent said contact surface such that a substantially thin gap is formed therebetween, said active circuit surface being electrically coupled to said contact surface at a plurality of electrical contacts in said gap;

a semi-rigid shroud device defining a vacuum chamber and configured to extend around said gap between the active circuit surface and the contact surface in a manner hermetically sealing said gap within said vacuum chamber such that a vacuum is formed therein; and a dispensing device having an outlet end positioned proximate said gap in said vacuum chamber and adapted to vacuum flow the bonding material between said electrical contacts, and between the active circuit surface and the contact surface to form a substantially voidless underfill layer of bonding material therebetween.

16. The semiconductor chip fabrication assembly as defined in claim 15 wherein, said shroud device includes a vacuum seal surface in sealing contact with a sealing surface of said semiconductor chip assembly for hermetic sealing therebetween.

17. The semiconductor chip fabrication assembly as defined in claim 16 further including:

a heater block device adapted to thermally contact a bottom surface of said packaging substrate, and defining said sealing surface such that said die, said packaging substrate and said gap are contained in said vacuum chamber.

18. The semiconductor chip fabrication assembly as defined in claim 17 wherein, said sealing surface of said heater block is upward facing and extends radially beyond the bottom surface of said packaging substrate, and said shroud device is belljar-shaped such that said vacuum seal surface is downward facing and opposite the heater block sealing surface.

19. The semiconductor chip fabrication assembly as defined in claim 18 further including:

a seal gasket positioned between said sealing surface and said vacuum seal surface.

20. The semiconductor chip fabrication assembly as defined in claim 19 wherein, said semi-rigid shroud device is composed of LEXAN.

21. The semiconductor chip fabrication assembly as defined in claim 15 wherein, said dispensing device includes a needle portion having said outlet end at a distal end thereof and adapted to pierce through said shroud device for positioning of said outlet end proximate said gap to dispense said bonding material.

22. The semiconductor chip fabrication assembly as defined in claim 21 wherein, said shroud device includes a needle gasket for piercing of said needle.

23. The semiconductor chip fabrication assembly as defined in claim 22 wherein, said bonding material is provided by thermo-set epoxy.

* * * * *